(12) United States Patent
Hu et al.

(10) Patent No.: US 11,171,098 B2
(45) Date of Patent: Nov. 9, 2021

(54) PACKAGE AND MANUFACTURING METHOD THEREOF

(71) Applicant: Taiwan Semiconductor Manufacturing Co., Ltd., Hsinchu (TW)

(72) Inventors: Tian Hu, Hsinchu (TW); Hung-Jui Kuo, Hsinchu (TW); Yu-Hsiang Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/548,826

(22) Filed: Aug. 22, 2019

(65) Prior Publication Data

US 2020/0105695 A1 Apr. 2, 2020

Related U.S. Application Data

(60) Provisional application No. 62/737,872, filed on Sep. 27, 2018.

(51) Int. Cl.
*H01L 23/00* (2006.01)
*H01L 21/56* (2006.01)
*H01L 23/31* (2006.01)

(52) U.S. Cl.
CPC ............ *H01L 24/09* (2013.01); *H01L 21/565* (2013.01); *H01L 23/3107* (2013.01); *H01L 24/03* (2013.01); *H01L 24/06* (2013.01); *H01L 2224/02331* (2013.01); *H01L 2224/02333* (2013.01); *H01L 2224/02372* (2013.01); *H01L 2224/02379* (2013.01); *H01L 2224/0401* (2013.01)

(58) Field of Classification Search
CPC ....... H01L 23/3128; H01L 2224/73204; H01L 2224/97; H01L 2924/181; H01L 23/5983; H01L 21/4857; H01L 2224/32145; H01L 21/56; H01L 23/5226; H01L 2224/0231; H01L 2224/02373
USPC ......... 257/686, 777; 438/107, 108, 109, 110
See application file for complete search history.

(56) References Cited

U.S. PATENT DOCUMENTS 8,350,381 B2 * 1/2013 Theuss .................... H01L 24/96
257/723
9,000,584 B2 4/2015 Lin et al.
(Continued)

*Primary Examiner* — David A Zarneke
(74) *Attorney, Agent, or Firm* — JCIPRNET

(57) ABSTRACT

A package includes a first redistribution structure, a die, a plurality of conductive structures, an encapsulant, and a second redistribution structure. The first redistribution structure includes a composite dielectric layer, a plurality of under bump metallization patterns, a dielectric layer, and a plurality of conductive patterns. The composite dielectric layer includes a first sub-layer and a second sub-layer stacked on the first sub-layer. The under bump metallization patterns are over the first sub-layer and penetrate through the composite dielectric layer. The dielectric layer is disposed on the second sub-layer of the composite dielectric layer. The conductive patterns are embedded in the dielectric layer. The die and the conductive structures are on the first redistribution structure. The encapsulant encapsulates the die and the conductive structures. The second redistribution structure is over the conductive structures, the encapsulant, and the die.

20 Claims, 16 Drawing Sheets

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2013/0105991 A1* | 5/2013 | Gan | H01L 25/105 257/777 |
| 2015/0287700 A1* | 10/2015 | Yu | H01L 23/5386 257/774 |
| 2016/0013144 A1* | 1/2016 | Chen | H01L 21/31111 257/774 |
| 2016/0071820 A1* | 3/2016 | Yu | H01L 24/19 257/737 |
| 2016/0126220 A1* | 5/2016 | Chen | H01L 23/528 257/737 |
| 2016/0379965 A1* | 12/2016 | Chen | H01L 25/50 257/686 |

\* cited by examiner

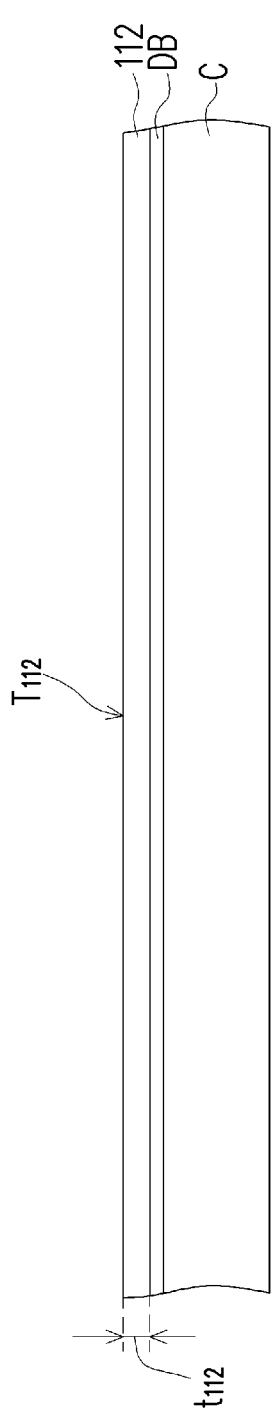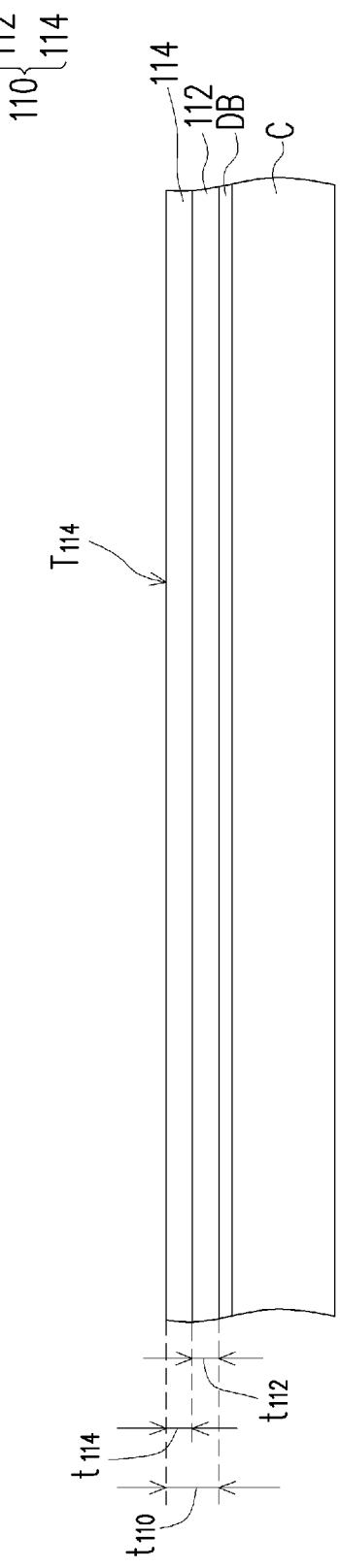

PACKAGE AND MANUFACTURING METHOD THEREOF

CROSS-REFERENCE TO RELATED APPLICATION

This application claims the priority benefit of U.S. provisional application Ser. No. 62/737,872, filed on Sep. 27, 2018. The entirety of the above-mentioned patent application is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. How to ensure the reliability of the integrated fan-out packages has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
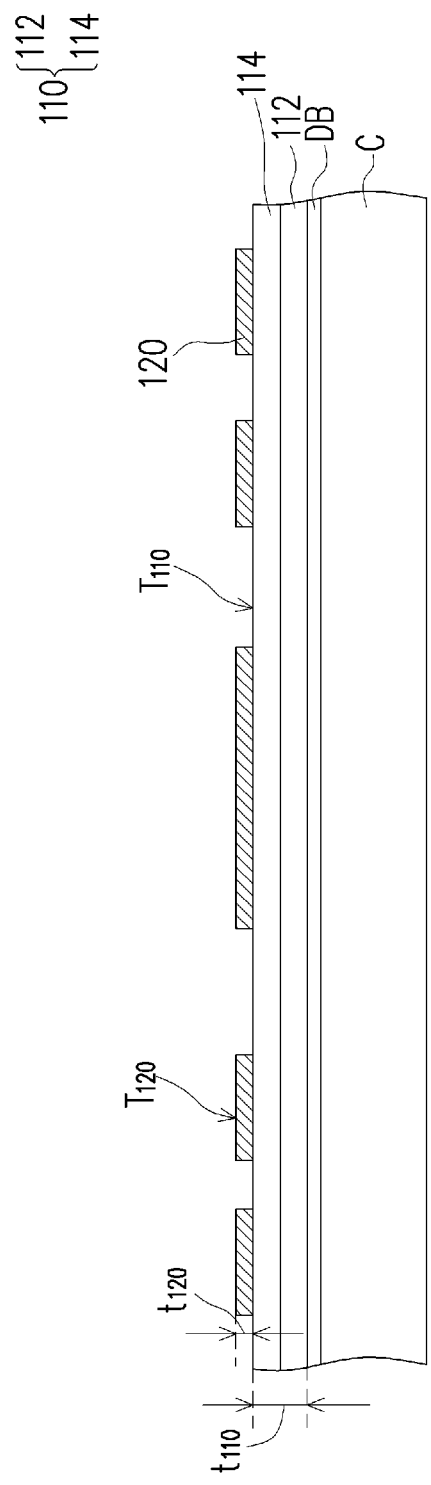
FIG. 1A to FIG. 1O are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1O are schematic cross-sectional views illustrating a manufacturing process of a package 10 in accordance with some embodiments of the disclosure. Referring to FIG. 1A, a carrier C having a de-bonding layer DB formed thereon is provided. In some embodiments, the de-bonding layer DB is formed on a top surface of the carrier C. In some embodiments, the carrier C may be a glass substrate and the de-bonding layer DB may be a light-to-heat conversion (LTHC) release layer formed on the glass substrate. However, the disclosure is not limited thereto. In some alternative embodiments, other suitable materials may be adapted for the carrier C and the de-bonding layer DB.

As illustrated in FIG. 1A, a buffer layer 112 is formed on the de-bonding layer DB. In some embodiments, the buffer layer 112 may be formed by spin coating a polymeric material on the de-bonding layer DB. The polymeric material may include low temperature polyimide (LTPI), epoxy resin, acrylic resin, phenol resin, benzocyclobutene (BCB), polybenzooxazole (PBO), or any other suitable polymer-based dielectric material. In some embodiments, the polymeric material is dissolved in a solvent to enhance the coating fluidity. In some embodiments, the buffer layer 112 is spin coated with a rotational speed of 350 rpm to 3500 rpm and a coating duration of 10 seconds to 80 seconds. After the polymeric material is uniformly coated on the de-bonding layer DB, a curing process is performed to enhance mechanical properties thereof and to evaporate the solvent. That is, the buffer layer 112 is cured. For example, the buffer layer 112 may be cured through a soft baking process. In some embodiments, a curing temperature of the buffer layer 112 may range between 150° C. and 300° C. In some embodiments, the buffer layer 112 may be formed to have a thickness $t_{112}$ ranges between 1 µm and 30 µm. Since the thickness $t_{112}$ of the buffer layer 112 is rather thin, the solvent may be uniformly evaporated during the curing process (for example, the soft baking process), thereby rendering a smooth top surface $T_{112}$ of the buffer layer 112. In some embodiments, since the solvent is uniformly evaporated, the molecules left on the de-bonding layer DB may be arranged in a uniform manner. That is, the buffer layer 112 may have a uniform density throughout the entire layer. In some embodiments, the density of the buffer layer 112 may range between 1 g/cm$^3$ and 2 g/cm$^3$.

Referring to FIG. 1B, an auxiliary buffer layer 114 is formed on the buffer layer 112. In some embodiments, the auxiliary buffer layer 114 may be formed by spin coating a polymeric material on the buffer layer 112. The polymeric material may include low temperature polyimide (LTPI), epoxy resin, acrylic resin, phenol resin, benzocyclobutene (BCB), polybenzooxazole (PBO), or any other suitable polymer-based dielectric material. In some embodiments, a material of the auxiliary buffer layer 114 may be the same as the material of the buffer layer 112. However, the disclosure is not limited thereto. In some alternative embodiments, the material of the auxiliary buffer layer 114 may be different from the material of the buffer layer 112. In some embodiments, the polymeric material is dissolved in a solvent to enhance the coating fluidity. In some embodiments, a rotational speed for spin coating the buffer layer 112 is larger than the rotational speed for spin coating the auxiliary buffer layer 114. For example, the auxiliary buffer layer 114 may be spin coated with the rotational speed of 300 rpm to 3000 rpm. On the other hand, the auxiliary buffer layer 114 may be spin coated with a coating duration of 10 seconds to 80 seconds. After the polymeric material is uniformly coated on the buffer layer 112, a curing process is performed to evaporate the solvent. That is, the auxiliary buffer layer 114 is cured. For example, the auxiliary buffer layer 114 may be cured through a soft baking process. The curing condition of the auxiliary buffer layer 114 may be the same as or different from the curing condition of the buffer layer 112. For example, a curing temperature of the auxiliary buffer layer 114 may range between 150° C. and 300° C.

In some embodiments, the auxiliary buffer layer 114 may be formed to have a thickness $t_{114}$ identical to the thickness $t_{112}$ of the buffer layer 112. However, the disclosure is not limited thereto. In some alternative embodiments, the thickness $t_{114}$ of the auxiliary buffer layer 114 may be larger than or smaller than the thickness $t_{112}$ of the buffer layer 112. For example, the thickness $t_{114}$ of the auxiliary buffer layer 114 may range between 1 µm and 30 µm. Since the thickness $t_{114}$ of the auxiliary buffer layer 114 is rather thin, the solvent may be uniformly evaporated during the curing process (for example, the soft baking process), thereby rendering a smooth top surface $T_{114}$ of the auxiliary buffer layer 114. In some embodiments, since the solvent is uniformly evaporated, the molecules left on the buffer layer 112 may be arranged in a uniform manner. That is, the auxiliary buffer layer 114 may have a uniform density throughout the entire layer. In some embodiments, the density of the auxiliary buffer layer 114 is identical to the density of the buffer layer 112. In some embodiments, the density of the auxiliary buffer layer 114 may range between 1 g/cm$^3$ and 2 g/cm$^3$.

It is noted that since the buffer layer 112 and the auxiliary buffer layer 114 are formed by two distinct processes, an interface may be seen between the buffer layer 112 and the auxiliary buffer layer 114. That is, although the buffer layer 112 and the auxiliary buffer layer 114 may be formed by a same material, the buffer layer 112 and the auxiliary buffer layer 114 are considered as two distinct layers. In some embodiments, the buffer layer 112 and the auxiliary buffer layer 114 may be collectively referred to as a composite dielectric layer 110.

As illustrated in FIG. 1B, the composite dielectric layer 110 is formed on the de-bonding layer DB. In some embodiments, the buffer layer 112 may be referred to as a first-sub layer of the composite dielectric layer 110 while the auxiliary buffer layer 114 may be referred to as a second sub-layer of the composite dielectric layer 110. In some embodiments, a thickness $t_{110}$ of the composite dielectric layer 110 ranges between 2 µm and 60 µm. When spin coating a layer with such thickness by a one-step coating process, the solvent may penetrate into the de-bonding layer DB while being evaporated at a non-uniform manner. As a result, the density within such layer would be non-uniform, resulting a wavy top surface. In some embodiments, such issue may be referred to as wrinkle defect. The wrinkle defect would cause the subsequently formed elements to be formed on a wavy surface, thereby rendering a wavy profile in these subsequently formed elements. That is, top surfaces of the subsequently formed elements would have a roughness greater than 1 µm. When wrinkle defect is presented, delamination or connection breakage of the elements may easily occur, thereby compromising the reliability of the subsequently formed package. Nevertheless, as mentioned above, the composite dielectric layer 110 is formed by two distinct processes. Since the first sub-layer (the buffer layer 112) and the second sub-layer (the auxiliary buffer layer 114) are respectively formed to have a thickness which allows uniform evaporation of the solvent, the smoothness of the top surface of the composite dielectric layer 110 may be ensured. That is, by forming the composite dielectric layer 110 through the steps illustrated in FIG. 1A to FIG. 1B, the wrinkle defect may be significantly reduced from 100% to 0%, thereby ensuring the reliability of the subsequently formed package.

Referring to FIG. 1C, a plurality of conductive patterns 120 is formed on the composite dielectric layer 110. In some embodiments, the conductive patterns 120 may be formed on the auxiliary buffer layer 114. In some embodiments, a material of the conductive patterns 120 include aluminum, titanium, copper, nickel, tungsten, and/or alloys thereof. The conductive patterns 120 may be formed by, for example, electroplating, deposition, and/or photolithography and etching. In some embodiments, the conductive patterns 120 may have a thickness $t_{120}$ of 2 µm to 20 µm. For example, a ratio of the thickness $t_{120}$ of each of the conductive patterns 120 to the thickness $t_{110}$ of the composite dielectric layer 110 ranges between 1:30 and 10:1. Since the conductive patterns 120 are formed on a smooth top surface (the top surface $T_{110}$ of the composite dielectric layer 110), top surfaces $T_{120}$ of the conductive patterns 120 are also substantially smooth. For example, a roughness of the top surfaces $T_{120}$ of the conductive patterns 120 may range between 0 µm and 0.5 µm.

Figure 1D:
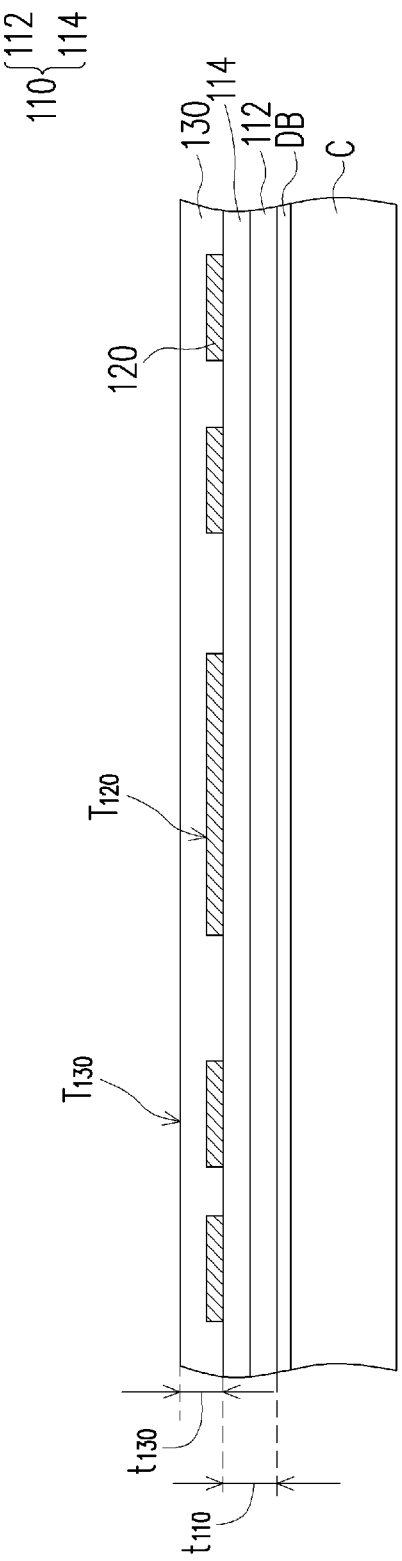

Referring to FIG. 1D, a dielectric layer 130 is formed on the composite dielectric layer 110 to cover the conductive patterns 120. In other words, the conductive patterns 120 are embedded in the dielectric layer 130. In some embodiments, the dielectric layer 130 may be formed on the auxiliary buffer layer 114. In some embodiments, a material of the dielectric layer 130 includes polyimide, epoxy resin, acrylic resin, phenol resin, benzocyclobutene (BCB), polybenzooxazole (PBO), or any other suitable polymer-based dielectric material. The dielectric layer 130, for example, may be formed by suitable fabrication techniques such as spin-on coating, chemical vapor deposition (CVD), plasma-enhanced chemical vapor deposition (PECVD), or the like. In some embodiments, the dielectric layer 130 may have a thickness $t_{130}$ of 5 µm to 50 µm. For example, a ratio of the thickness $t_{130}$ of the dielectric layer 130 to the thickness $t_{110}$ of the composite dielectric layer 110 ranges between 1:12 and 25:1. Since the dielectric layer 130 is formed on a smooth top surface (the top surface $T_{110}$ of the composite dielectric layer 110), a top surface $T_{130}$ of the dielectric layer 130 is also substantially smooth. For example, a roughness of the top surface $T_{130}$ of the dielectric layer 130 may range between 0 μm and 0.1 μm.

It should be noted that the number of the conductive patterns 120 and the number of the dielectric layer 130 illustrated in FIG. 1D are merely for illustrative purposes, and the disclosure is not limited thereto. In some alternative embodiments, more layers of the conductive patterns and more layers of the dielectric layer may be formed depending on the circuit design. When more layers of conductive patterns and more layers of the dielectric layers are adapted, these conductive patterns and these dielectric layers are stacked alternately, and the conductive patterns are interconnected with one another by a plurality of conductive vias (not shown).

Figure 1E:
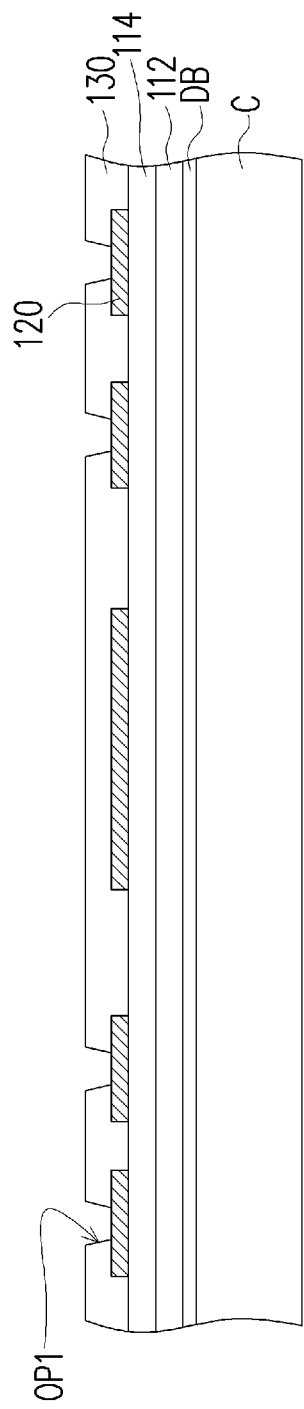

Referring to FIG. 1E, a plurality of contact openings OP1 is formed in the dielectric layer 130 to expose at least a portion of the conductive patterns 120. In some embodiments, the contact openings OP1 may be formed by a photolithography process and an etching process.

Figure 1F:
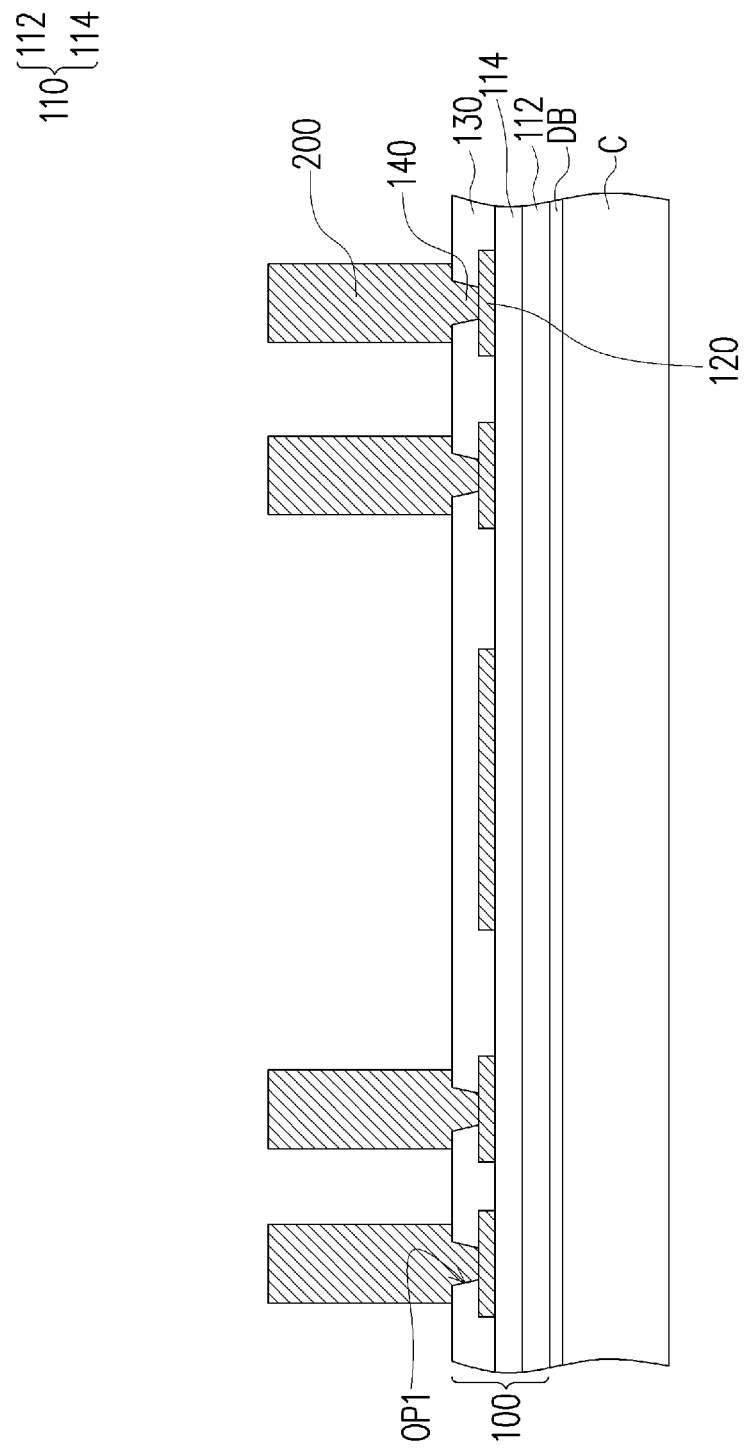

Referring to FIG. 1F, a plurality of conductive vias 140 is formed in the contact openings OP1 and a plurality of conductive structures 200 is formed over the dielectric layer 130. In some embodiments, materials of the conductive structures 200 and the conductive vias 140 include copper, copper alloys, or the like. In some embodiments, the conductive structures 200 are conductive pillars formed by a photolithography process, a plating process, a photoresist stripping processes, and/or any other suitable processes. In some embodiments, the conductive structures 200 may be formed simultaneously with the conductive vias 140 during the same stage. For example, a seed material layer (not shown) extending into the contact openings OP1 may be formed over the dielectric layer 130. In some embodiments, the seed material layer includes a titanium/copper composite layer and is formed by a sputtering process. A mask pattern (not shown) may then be formed on the seed material layer. The mask pattern has openings exposing the seed material layer located inside of the contact openings OP1 of the dielectric layer 130. In some embodiments, the openings of the mask pattern also exposes portions of the seed material layer in proximity of the contact openings OP1. Thereafter, a conductive material is filled into the openings and the contact openings OP1 by electroplating or deposition. Then, the mask pattern and the seed material layer underneath the mask pattern is removed to obtain the conductive structures 200 and the conductive vias 140. However, the disclosure is not limited thereto. In some alternative embodiments, other suitable methods may be utilized to form the conductive structures 200 and the conductive vias 140. For example, the conductive structures 200 and the conductive vias 140 may be formed separately.

In some embodiments, the composite dielectric layer 110, the conductive patterns 120, the dielectric layer 130, and the conductive vias 140 may constitute a first redistribution structure 100. It should be note that the first redistribution structure 100 may further include other subsequently formed elements. In some embodiments, the first redistribution structure 100 may be referred to as a back-side redistribution structure.

As illustrated in FIG. 1F, the conductive structures 200 are formed on the first redistribution structure 100. In some embodiments, the conductive structures 200 are formed on the dielectric layer 130 and are in contact with the conductive vias 140 to render electrical connection with the first redistribution structure 100. It should be noted that the number of the conductive structures 200 shown in FIG. 1F merely serves as an exemplary illustration, and the number of the conductive structures 200 may be varied based on demand.

Figure 1G:
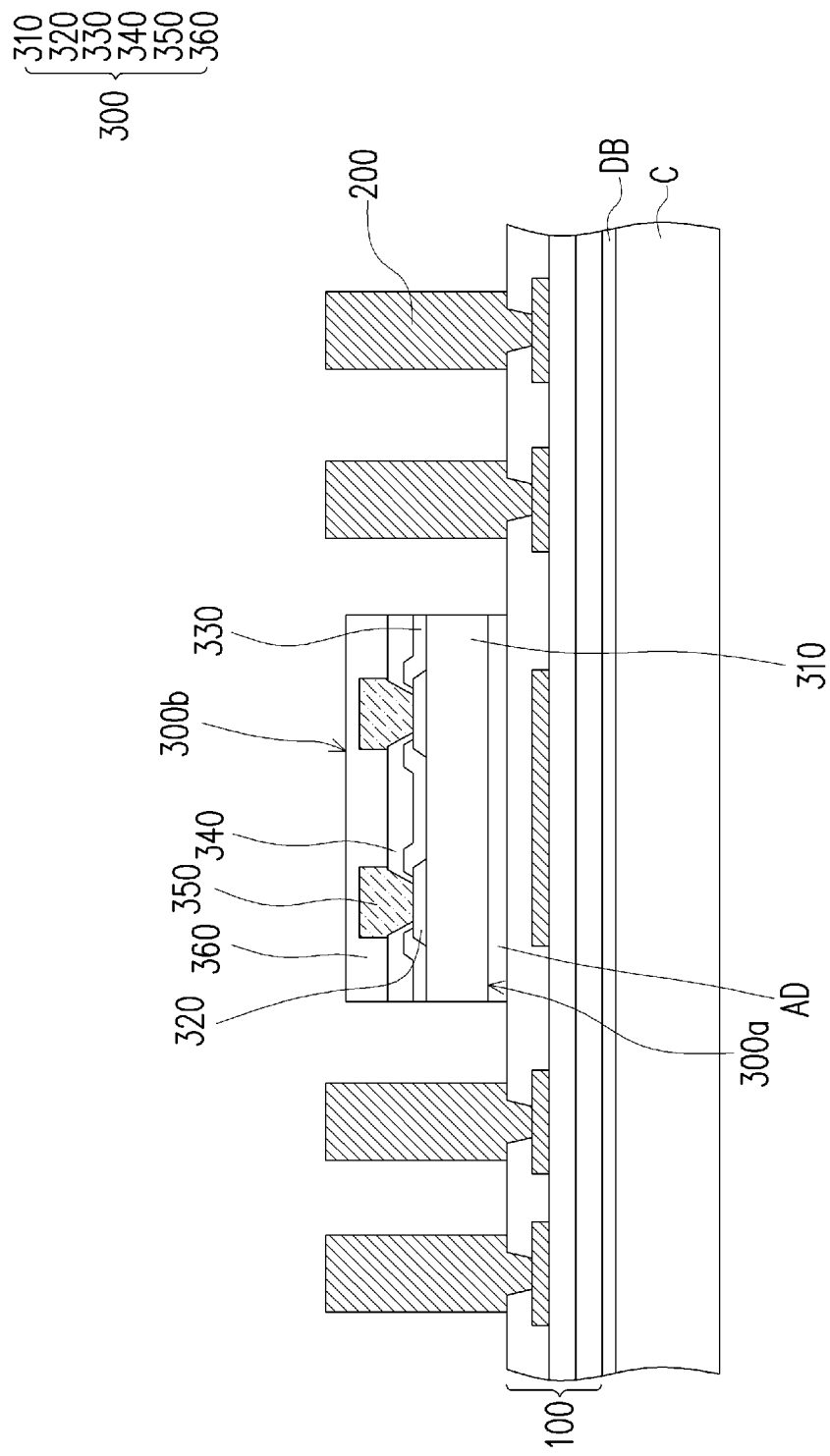

Referring to FIG. 1G, a plurality of dies 300 is formed on the first redistribution structure 100. For simplicity, one die 300 is shown in FIG. 1G. In some embodiments, the dies 300 are placed such that the conductive structures 200 surround the dies 300. In some embodiments, the dies 300 are picked and placed onto the first redistribution structure 100. Each of the dies 300, for example, includes a semiconductor substrate 310, a plurality of conductive pads 320, a passivation layer 330, a post passivation layer 340, a plurality of vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed from the contact openings of the post passivation layer 340. The post-passivation layer 340 may be a polyimide layer, a PBO layer, or a dielectric layer formed by other suitable polymers. In some embodiments, the post-passivation layer 340 may be optional. In addition, the vias 350 are formed on the conductive pads 320. In some embodiments, the vias 350 are made of conductive materials and are plated on the conductive pads 320. For example, a material of vias 350 may include copper, copper alloys, or the like. The protection layer 360 is formed on the post-passivation layer 340 to cover the vias 350.

As illustrated in FIG. 1G, the die 300 has a rear surface 300a and a front surface 300b opposite to the rear surface 300a. In some embodiments, the rear surface 300a of the die 300 is attached (or adhered) to the first redistribution structure 100 through an adhesive layer AD. In some embodiments, the adhesive layer AD may include a die attach film (DAF) or other materials having adhesion property. On the other hand, the front surface 300b of the die 300 faces upward. As illustrated in FIG. 1G, top surface (the front surface 300b) of the die 300 is located at a level height lower than the top surfaces of the conductive structures. However, the disclosure is not limited thereto. In some alternative embodiments, the top surface of the die 300 may be substantially coplanar with top surfaces of the conductive structures 200 or may be located at a level height higher than the top surfaces of the conductive structures 200.

Although FIG. 1F and FIG. 1G illustrated that the conductive structures 200 are formed prior to the placement of the dies 300, the disclosure is not limited thereto. In some alternative embodiments, the dies 300 may be placed before the conductive structures 200 are formed on the first redistribution structure 100.

Figure 1H:
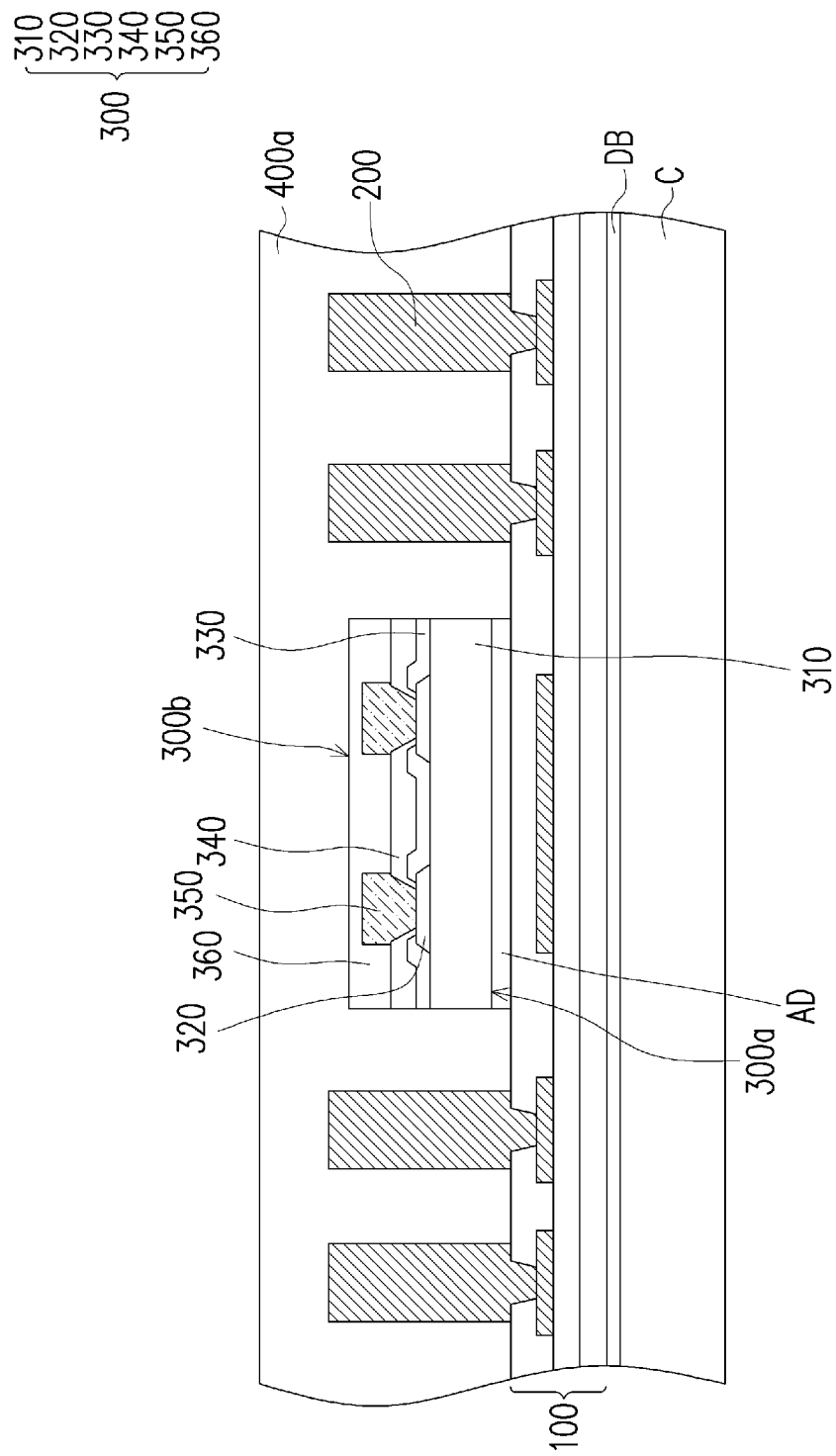

Referring to FIG. 1H, an encapsulation material 400a is formed over the first redistribution structure 100 to encapsulate the conductive structures 200 and the dies 300. For example, the conductive structures 200 and the protection layer 360 of the dies 300 are encapsulated by the encapsulation material 400a. In other words, the conductive structures 200 and the protection layer 360 of the dies 300 are not revealed and are well protected by the encapsulation material 400a. In some embodiments, the encapsulation material 400a is a molding compound, a molding underfill, a resin (such as epoxy), or the like. In some embodiments, the encapsulation material 400a may include fillers. In some embodiments, the encapsulation material 400a may be formed by a molding process. For example, the encapsulation material 400a may be formed by a compression molding process.

Figure 1I:
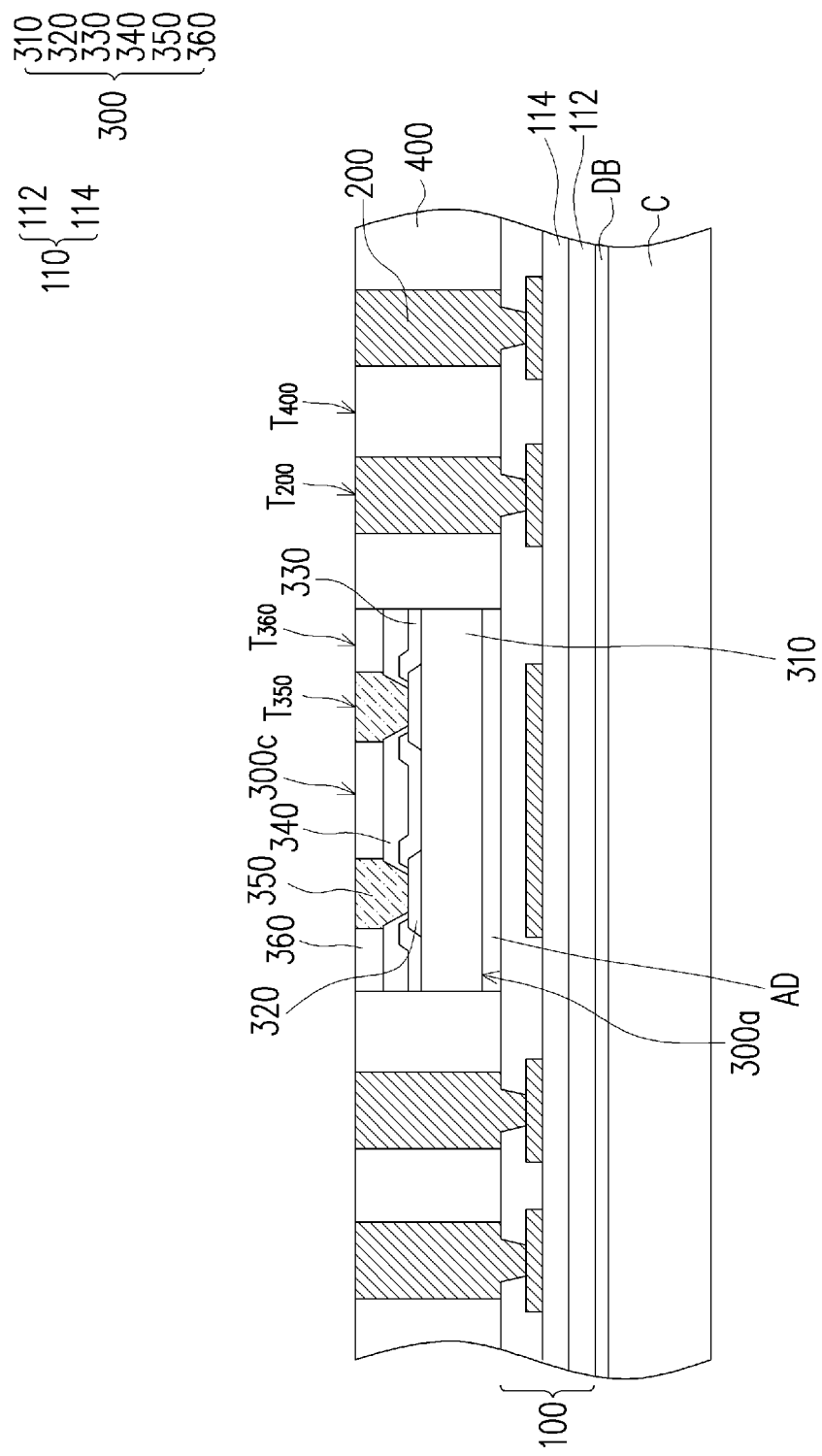

Referring to FIG. 1H and FIG. 1I, the encapsulation material 400a and the protection layer 360 of the dies 300 are grinded until top surfaces $T_{350}$ of the vias 350 and top surfaces $T_{200}$ of the conductive structures 200 are exposed. After the encapsulation material 400a is grinded, an encapsulant 400 is formed over the first redistribution structure 100 to encapsulate the conductive structures 200 and the dies 300. In some embodiments, the encapsulation material 400a is grinded by a mechanical grinding process and/or a chemical mechanical polishing (CMP) process. In some embodiments, during the grinding process of the encapsulation material 400a, the protection layer 360 is grinded to reveal the vias 350. In some embodiments, portions of the vias 350 and portions of the conductive structures 200 are slightly grinded as well. After grinding, each die 300 has an active surface 300c and a rear surface 300a opposite to the active surface 300c. The exposed portion of the vias 350 is located on the active surfaces 300c of the dies 300. The encapsulant 400 encapsulates sidewalls of the dies 300. In some embodiments, the encapsulant 400 is penetrated by the conductive structures 200. In other words, the dies 300 and the conductive structures 200 are embedded in the encapsulant 400. It is noted that the top surfaces $T_{200}$ of the conductive structures 200, the top surface $T_{360}$ of the protection layer 360, and the top surfaces $T_{350}$ of the vias 350 are substantially coplanar with a top surface $T_{400}$ of the encapsulant 400.

In some embodiments, during the grinding process of the encapsulation material, stress may be generated. The stress may be guided by the conductive structures and travels to the interface between the back-side redistribution structure and the de-bonding layer, thereby inducing delamination of the back-side redistribution structure on the interface. As a result, dent defect in the back-side redistribution structure may occur and the reliability of the subsequently formed package is compromised. However, as mentioned above, the first redistribution structure 100 includes a composite dielectric layer 110 having a thickness $t_{110}$ of 2 μm to 60 μm. The total thickness of the first sub-layer (the buffer layer 112) and the second sub-layer (the auxiliary buffer layer 114) of the composite dielectric layer 110 is able to provide a buffering function such that the stress is vanished before reaching the interface between the first redistribution structure 100 and the de-bonding layer DB. As such, the dent defect may be reduced from 100% to 0%, thereby enhancing the reliability of the subsequently formed package.

Figure 1J:
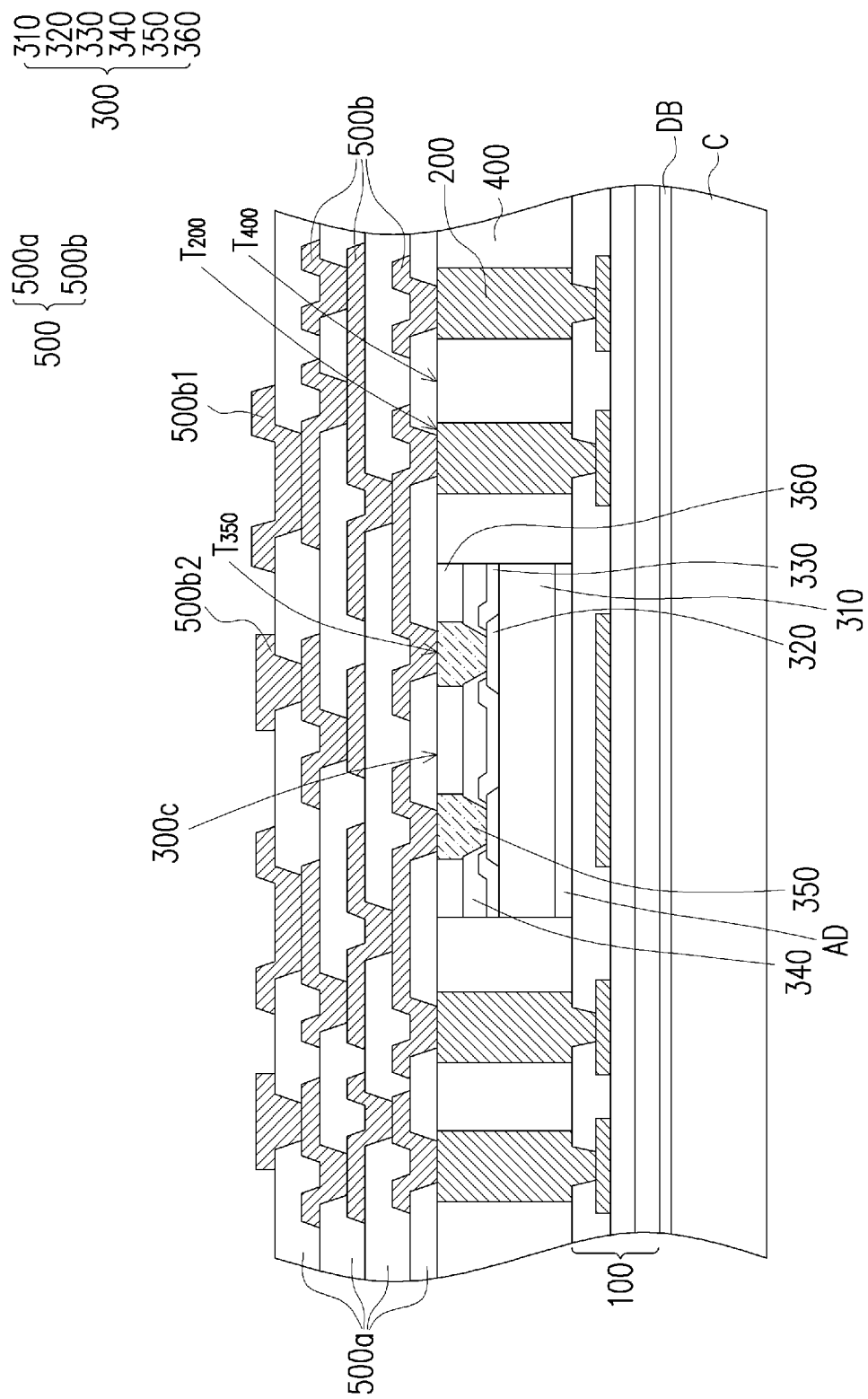

Referring to FIG. 1J, a second redistribution structure 500 electrically connected to the conductive vias 350 of the dies 300 and the conductive structures 200 is formed on the top surfaces $T_{200}$ of the conductive structures 200, the top surface $T_{400}$ of the encapsulant 400, and the active surface 300c of the die 300. In some embodiments, the second redistribution structure 500 includes a plurality of inter-dielectric layers 500a and a plurality of redistribution conductive layers 500b stacked alternately. The redistribution conductive layers 500b are electrically connected to the conductive vias 350 of the dies 300 and the conductive structures 200 embedded in the encapsulant 400. In some embodiments, the top surfaces $T_{350}$ of the conductive vias 350 and the top surfaces $T_{200}$ of the conductive structures 200 are in contact with the bottommost redistribution conductive layer 500b of the second redistribution structure 500. In some embodiments, the top surfaces $T_{350}$ of the conductive vias 350 and the top surfaces $T_{200}$ of the conductive structures 200 are partially covered by the bottommost inter-dielectric layer 500a. In some embodiments, a material of the redistribution conductive layers 500b include aluminum, titanium, copper, nickel, tungsten, and/or alloys thereof. The redistribution conductive layers 500b may be formed by, for example, electroplating, deposition, and/or photolithography and etching. In some embodiments, a material of the inter-dielectric layers 500a includes polyimide, epoxy resin, acrylic resin, phenol resin, benzocyclobutene (BCB), polybenzooxazole (PBO), or any other suitable polymer-based dielectric material. The inter-dielectric layers 500a, for example, may be formed by suitable fabrication techniques such as spin-on coating, chemical vapor deposition (CVD), plasma-enhanced chemical vapor deposition (PECVD), or the like.

As illustrated in FIG. 1J, the topmost redistribution conductive layer 500b includes a plurality of pads. In some embodiments, the above-mentioned pads include a plurality of under-ball metallurgy (UBM) patterns 500b1 for ball mount and/or at least one connection pads 500b2 for mounting of passive components. The number of the inter-dielectric layers 500a and the redistribution conductive layers 500b is not limited in the disclosure. In some embodiments, the configurations of the UBM patterns 500b1 and the connection pads 500b2 may be determined based on circuit design.

Figure 1K:
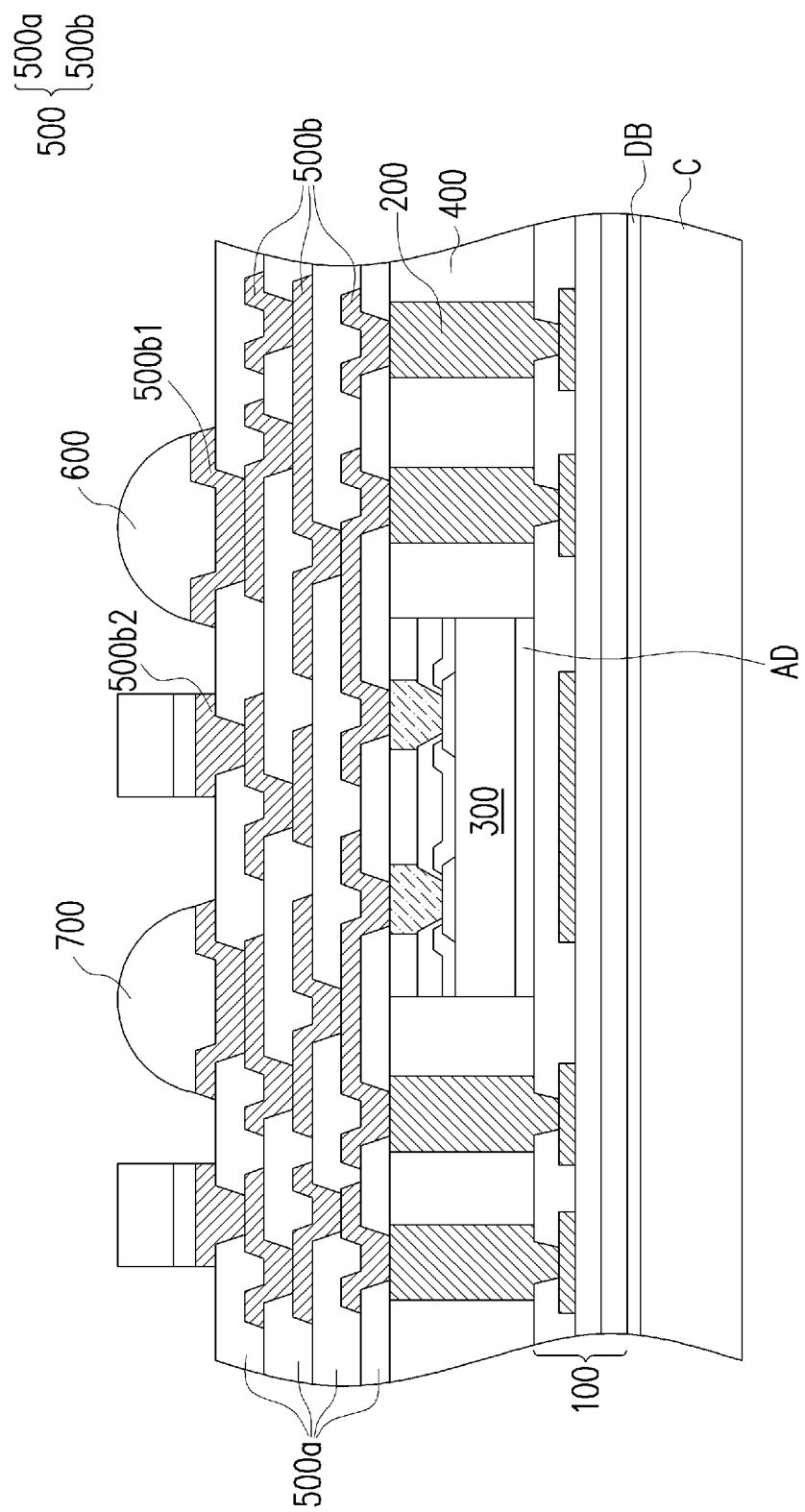

Referring to FIG. 1K, after the second redistribution structure 500 is formed, a plurality of conductive terminals 600 are placed on the under-ball metallurgy patterns 500b1 and a plurality of passive components 700 are mounted on the connection pads 500b2. In some embodiments, the conductive terminals 600 include solder balls. On the other hand, the passive components 700 are, for example, capacitors, resistors, inductors, antennas, the like, or a combination thereof. In some embodiments, the conductive terminals 600 may be placed on the under-ball metallurgy patterns 500b1 through a ball placement process and the passive components 700 may be mounted on the connection pads 500b2 through a soldering process and/or a reflowing process.

Figure 1L:
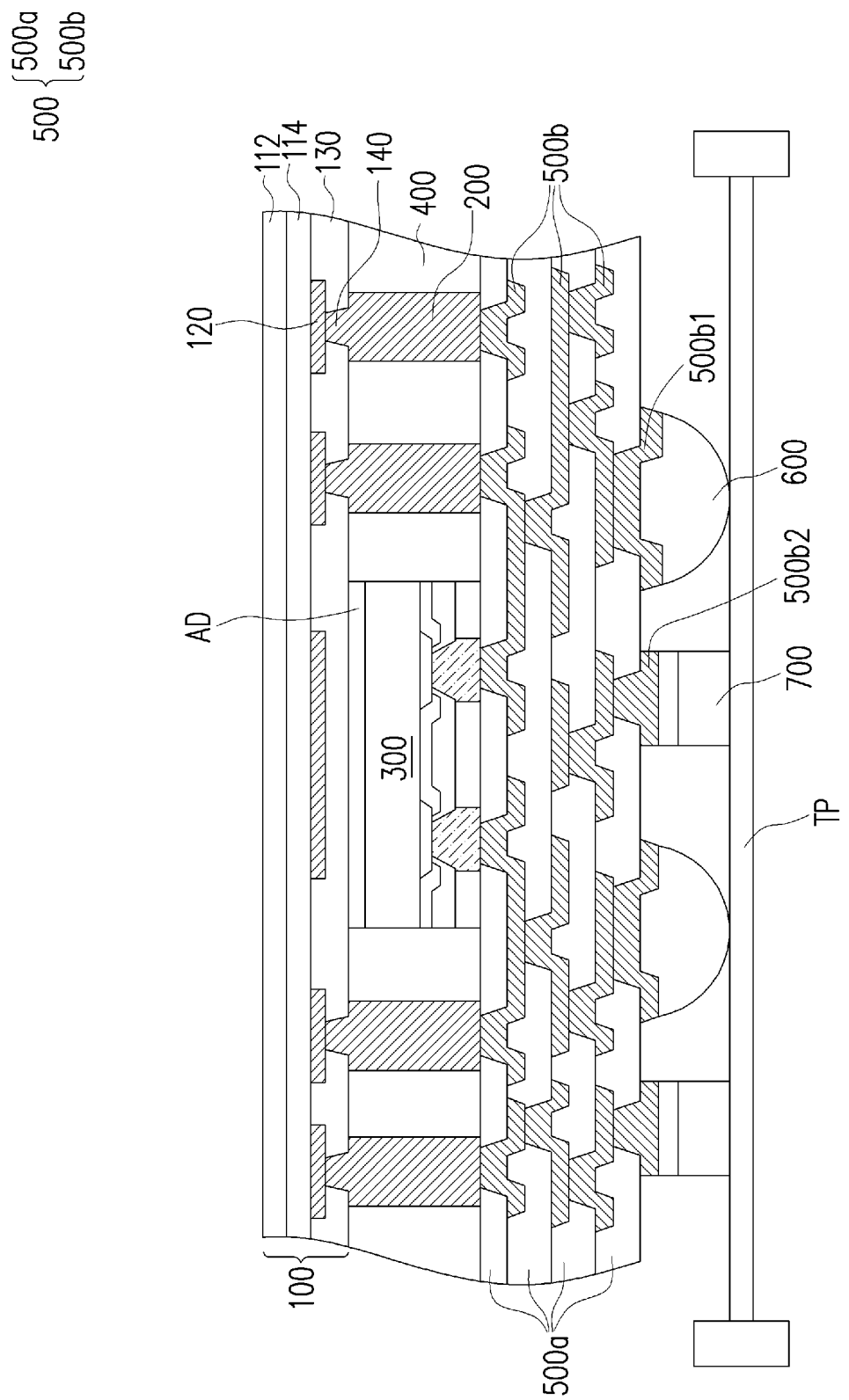

Referring to FIG. 1K and FIG. 1L, after the conductive terminals 600 and the passive components 700 are mounted on the second redistribution structure 500, the structure illustrated in FIG. 1K is flipped upside down and is placed on a tape TP. Thereafter, the de-bonding layer DB and the carrier C are removed from the first redistribution structure 100. In some embodiments, the de-bonding layer DB (e.g., the LTHC release layer) may be irradiated by an UV laser such that the carrier C and the de-bonding layer DB may be peeled off from the buffer layer 112. Nevertheless, the de-bonding process is not limited thereto. Other suitable de-carrier methods may be used in some alternative embodiments.

Figure 1M:
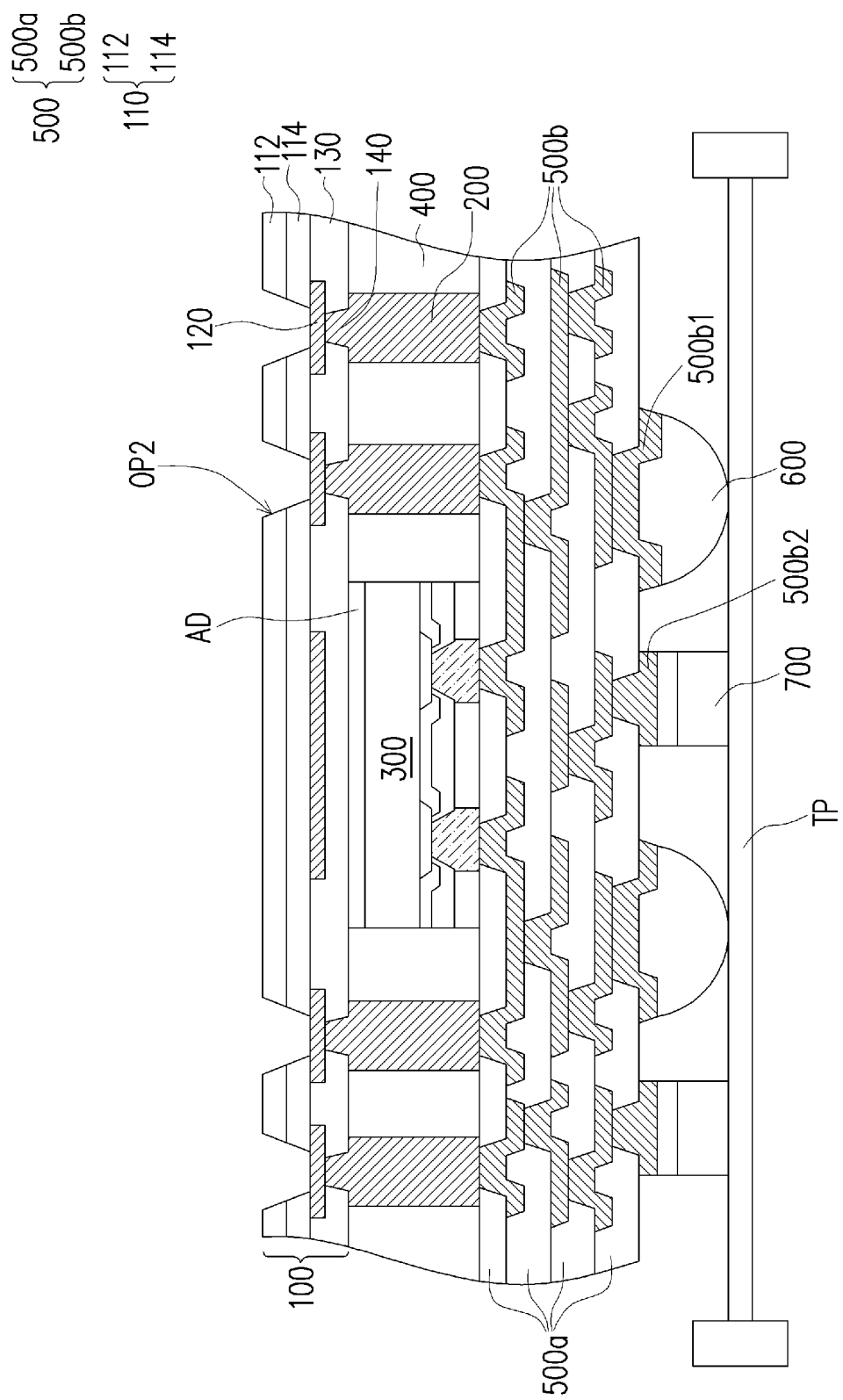

Referring to FIG. 1M, a plurality of openings OP2 is formed in the composite dielectric layer 110. In some embodiments, the openings OP2 are formed by a laser drilling process, a mechanical drilling process, a photolithography process and an etching process, or other suitable processes. In some embodiments, the openings OP2 are formed to penetrate through the composite dielectric layer 110. For example, each of the openings OP2 penetrates through the buffer layer 112 and the auxiliary buffer layer 114 to expose at least a portion of the conductive patterns 120.

Figure 1N:
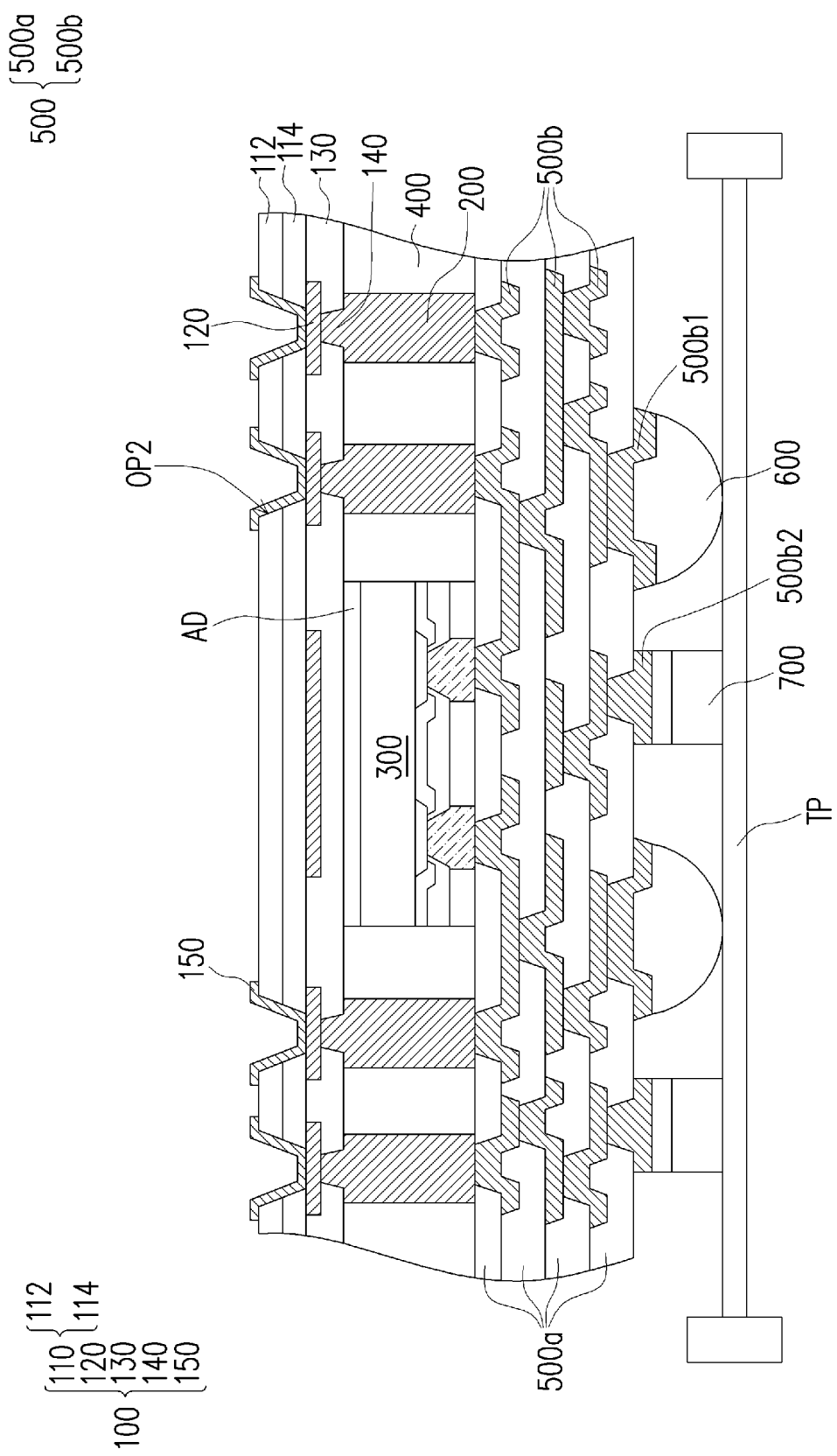
Figure 10:
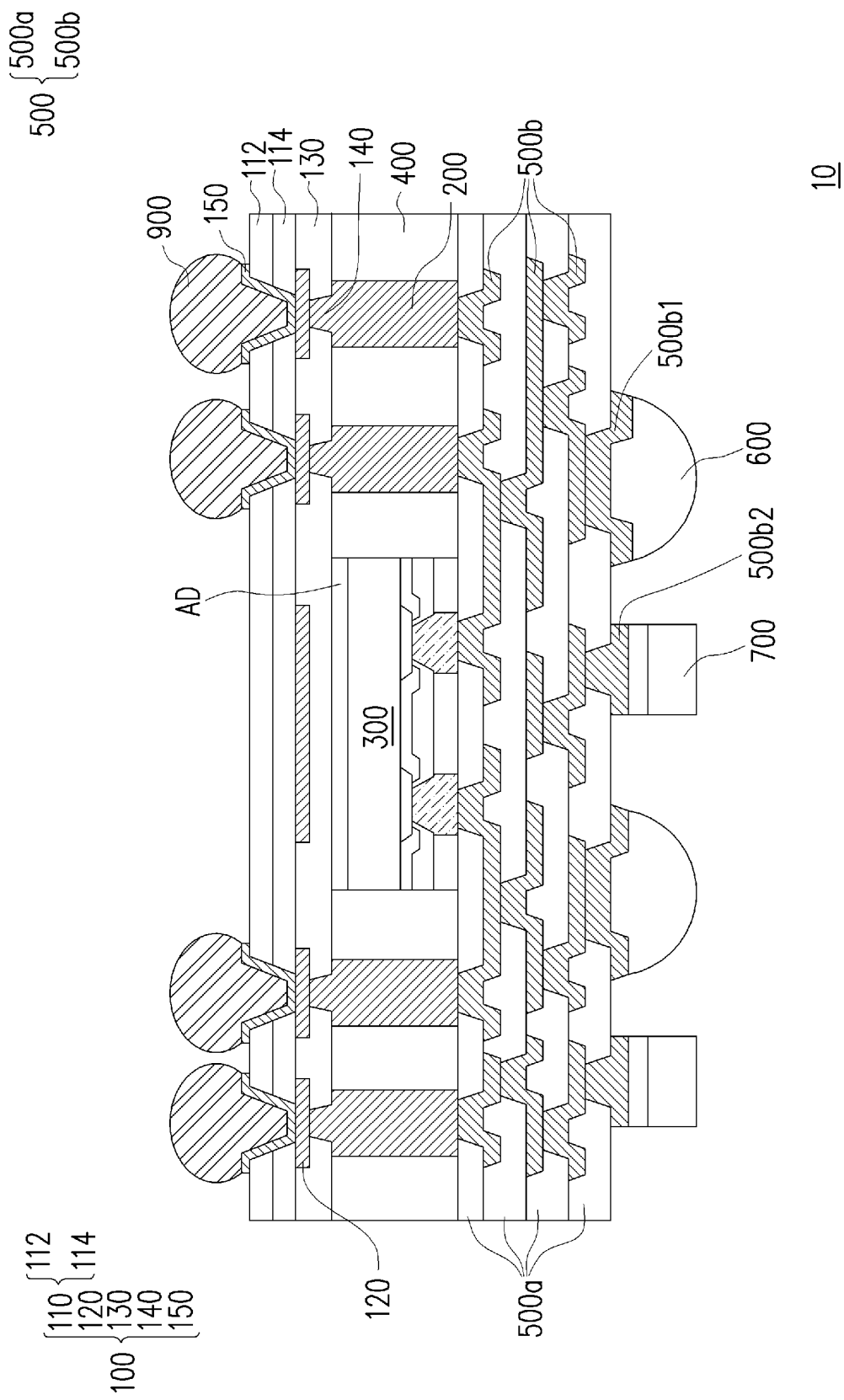

Referring to FIG. 1N, a plurality of under bump metallization (UBM) patterns 150 is formed on the composite layer 110 and in the openings OP2. In some embodiments, the under bump metallization patterns 150 extend into the openings OP2 to contact the conductive patterns 120. For example, a portion of each under bump metallization pattern 150 is disposed over the first sub-layer (the buffer layer 112) of the composite dielectric layer 110 and another portion of each under bump metallization pattern 150 penetrates through the composite dielectric layer 110. In some embodiments, a material of the under bump metallization patterns 150 include aluminum, titanium, copper, nickel, tungsten, and/or alloys thereof. The under bump metallization patterns 150 may be formed by, for example, electroplating, deposition, and/or photolithography and etching. In some embodiments, the under bump metallization patterns 150 may be considered as part of the first redistribution structure 100. In other words, the first redistribution structure 100 may include the composite dielectric layer 110, the conductive patterns 120, the dielectric layer 130, the conductive vias 140, and the under bump metallization patterns 150.

Referring to FIG. 1O, a plurality of conductive terminals 900 is disposed over the under bump metallization patterns 150. In some embodiments, the conductive terminals 900 are electrically connected to the first redistribution structure 100 through the under bump metallization patterns 150. In some embodiments, the conductive terminals 900 are attached to the under bump metallization patterns 150 through a solder flux (not shown). In some embodiments, the conductive terminals 900 are, for example, solder balls. In some embodiments, the conductive terminals 900 may be disposed on the under bump metallization patterns 150 by a ball placement process and/or a reflow process. After forming the conductive terminals 900 on the under bump metallization patterns 150, a singulation process is performed and the tape TP is removed to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the package 10 may be referred to as an integrated fan-out (InFO) package. However, the disclosure is not limited thereto. In some alternative embodiments, the package 10 may be other types of packages.

Figure 2:
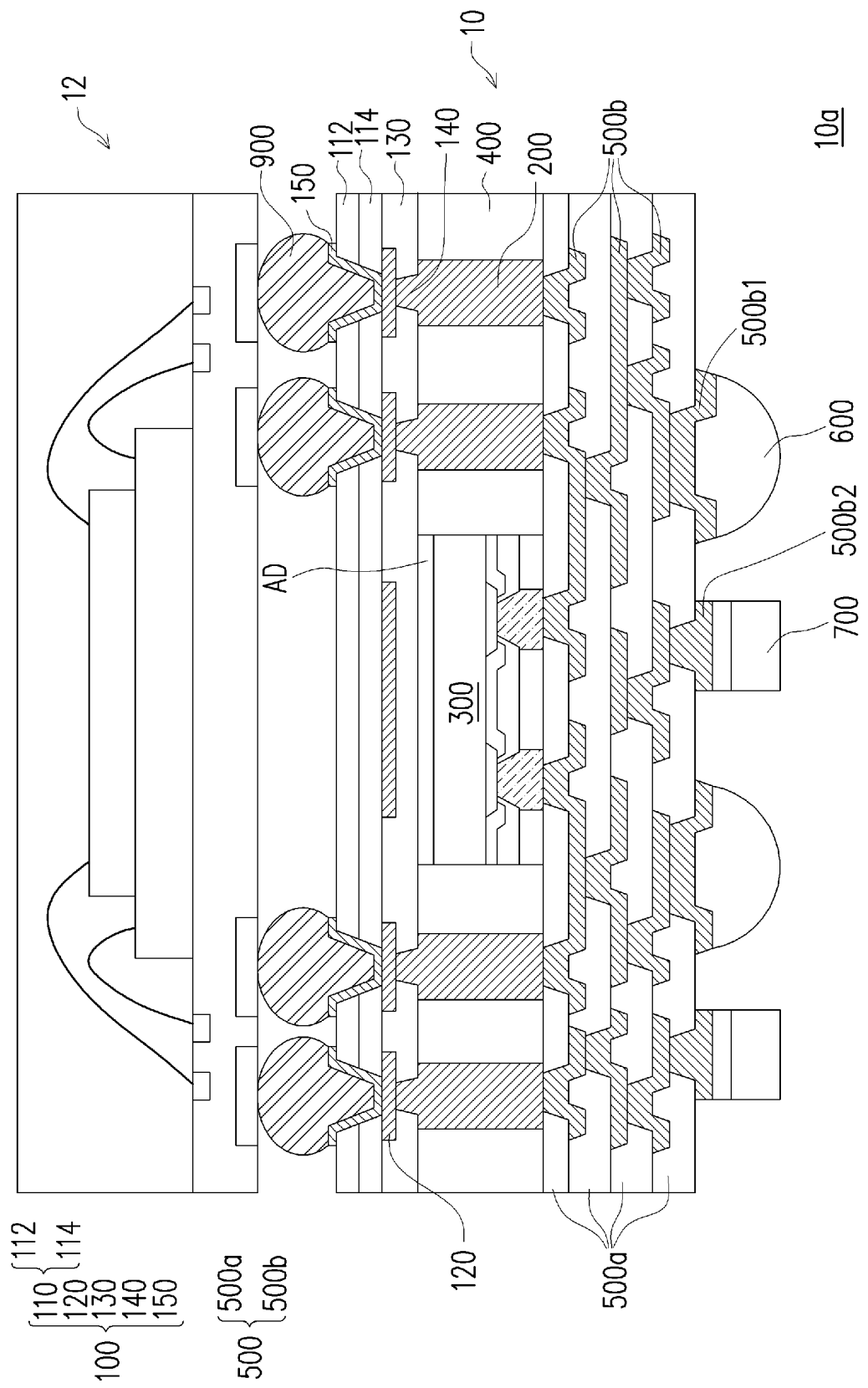
FIG. 2 is a schematic cross-sectional view illustrating a package-on-package structure in accordance with some embodiments of the disclosure.

FIG. 2 is a schematic cross-sectional view illustrating a package-on-package structure 10a in accordance with some embodiments of the disclosure. In some embodiments, the package 10 in FIG. 1O may have a dual-side terminal design to accommodate electronic components on both sides. For example, referring to FIG. 2, a sub-package 12 may be stacked on the package 10. The sub-package 12 is, for example, IC packages. The sub-package 12 is electrically connected to the package 10 through the conductive terminals 900. In some embodiments, after the sub-package 12 is stacked on the package 10, a reflowing process is further performed to enhance the adhesion between the package 10 and the sub-package 12. It is noted that FIG. 2 merely serves as an exemplary illustration, and the disclosure is not limited thereto. In some alternative embodiments, other electronic devices such as an integrated fan-out (InFO) package, a memory device, a ball grid array (BGA), or a wafer may be stacked over the package 10 in place of the sub-packages 12.

Figure 3:
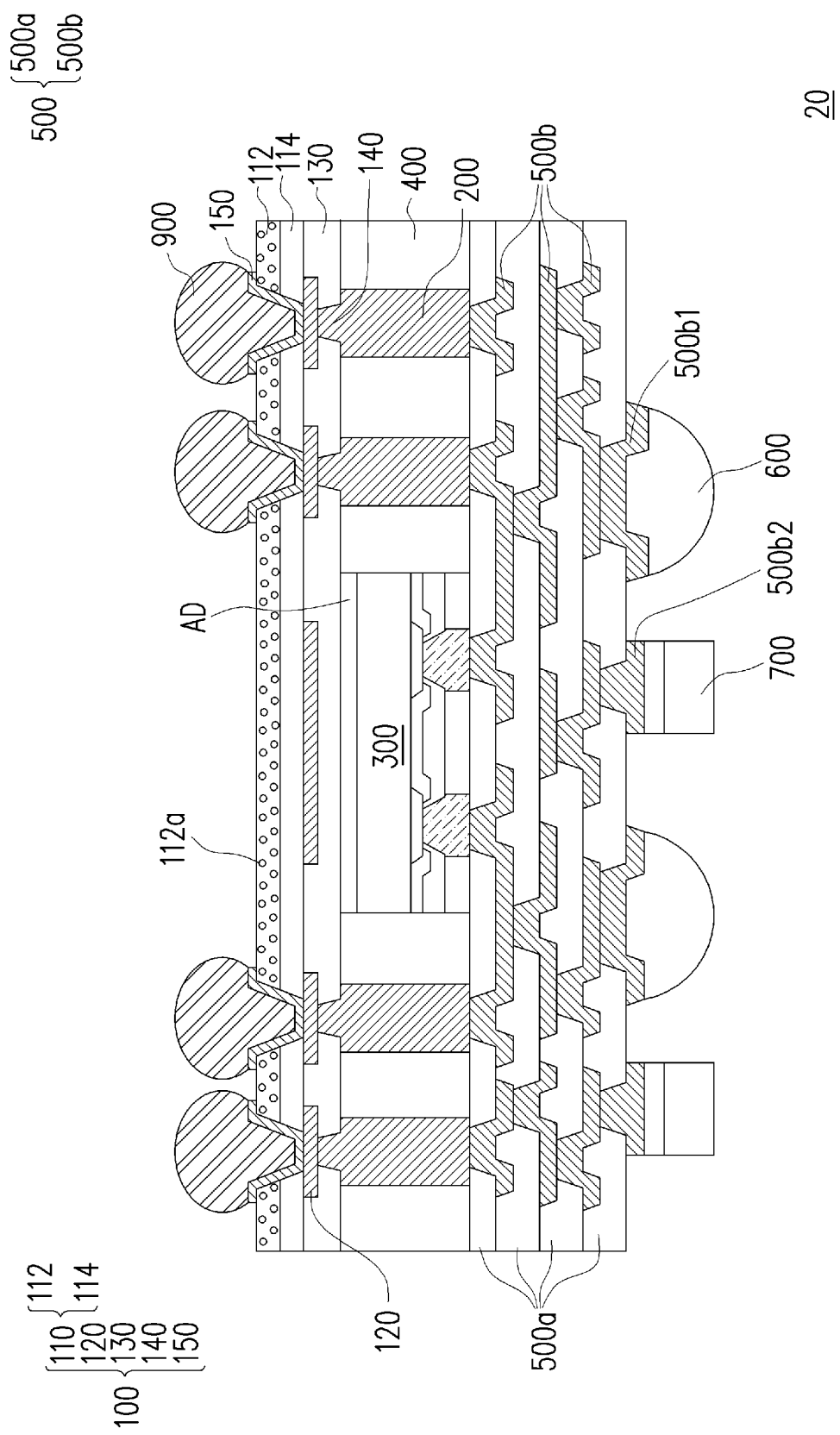
FIG. 3 is a schematic cross-sectional view illustrating a package in accordance with some alternative embodiments of the disclosure.

FIG. 3 is a schematic cross-sectional view illustrating a package 20 in accordance with some alternative embodiments of the disclosure. Referring to FIG. 3, the package 20 is similar to the package 10 illustrated in FIG. 1O, so the detailed descriptions thereof are omitted herein. The difference between the package 10 of FIG. 1O and the package 20 of FIG. 3 lies in that in the package 20, the first sub-layer (the buffer layer 112) of the composite dielectric layer 110 further includes fillers 112a to enhance the mechanical strength of the buffer layer 112. In some embodiments, a material of the fillers 112a may include carbon black, Rhodamine B, or Mauveine. In some embodiments, the fillers 112a are randomly distributed in the buffer layer 112. On the other hand, the second sub-layer (the auxiliary buffer layer 114) of the composite dielectric layer 110 is free of filler. However, the disclosure is not limited thereto. In some alternative embodiments, the buffer layer 112 and the auxiliary buffer layer 114 may both include fillers.

Figure 4:
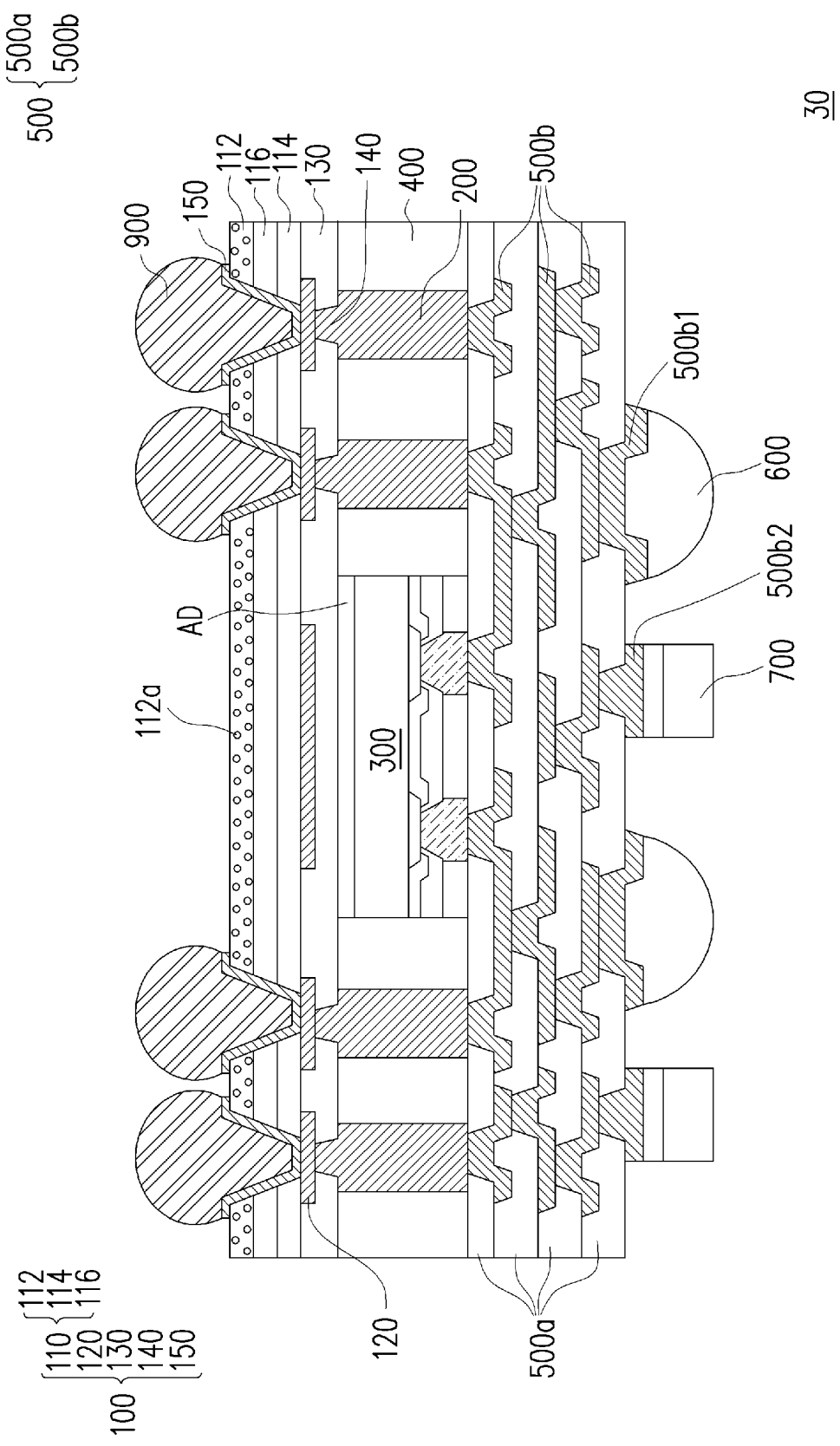
FIG. 4 is a schematic cross-sectional view illustrating a package in accordance with some alternative embodiments of the disclosure.

FIG. 4 is a schematic cross-sectional view illustrating a package 30 in accordance with some alternative embodiments of the disclosure. Referring to FIG. 4, the package 30 is similar to the package 20 illustrated in FIG. 3, so the detailed descriptions thereof are omitted herein. The difference between the package 20 of FIG. 3 and the package 30 of FIG. 4 lies in that in the package 30, the composite dielectric layer 110 further includes a third-sub layer sandwiched between the first sub-layer (the buffer layer 112) and the second sub-layer (the auxiliary buffer layer 114). In some embodiments, a thickness of the third-sub layer may range between 1 μm and 30 μm. In other words, a thickness of the composite dielectric layer 110 in FIG. 4 may range between 3 μm and 90 μm. In some embodiments, the third-sub layer may include dye. In other words, the third-sub layer is colored, so the third-sub layer may be referred to as a colored layer 116. In some embodiments, the color of the colored layer 116 may be black, so the contrast of subsequently imprinted laser mark may be enhanced. In some embodiments, the colored layer 116 may further strengthen the buffering function of the composite dielectric layer 110, thereby ensuring the elimination of the dent defect. Although FIG. 4 illustrated that the buffer layer 112 includes filler, the disclosure is not limited thereto. In some alternative embodiments, the composite dielectric layer 110 may be constituted by the buffer layer 112, the colored layer 116, and the auxiliary buffer layer 114 while both of the buffer layer 112 and the auxiliary buffer layer 114 are free of filler.

In accordance with some embodiments of the disclosure, a package includes a first redistribution structure, a die, a plurality of conductive structures, an encapsulant, and a second redistribution structure. The first redistribution structure includes a composite dielectric layer, a plurality of under bump metallization patterns, a dielectric layer, and a plurality of conductive patterns. The composite dielectric layer includes a first sub-layer and a second sub-layer stacked on the first sub-layer. The under bump metallization patterns are over the first sub-layer and penetrate through the composite dielectric layer. The dielectric layer is disposed on the second sub-layer of the composite dielectric layer. The conductive patterns are embedded in the dielectric layer. The die and the conductive structures are on the first redistribution structure. The encapsulant encapsulates the die and the conductive structures. The second redistribution structure is over the conductive structures, the encapsulant, and the die.

In accordance with some embodiments of the disclosure, a method of manufacturing a package includes at least the following steps. A carrier having a de-bonding layer formed thereon is provided. A first redistribution structure is formed on the de-bonding layer. A plurality of conductive structures is formed over the first redistribution structure. A die is placed over the first redistribution structure. The conductive structures and the die are encapsulated by an encapsulant. A second redistribution structure is formed over the conductive structures, the encapsulant, and the die. The method of forming the first redistribution structure includes at least the following steps. A composite dielectric layer is formed on the de-bonding layer. A plurality of conductive patterns is formed on the composite dielectric layer. A dielectric layer is formed on the composite dielectric layer to cover the conductive patterns. The method of forming the composite dielectric layer includes at least the following steps. A first sub-layer is spin coated on the de-bonding layer. Then, the first sub-layer is cured. Subsequently, a second sub-layer is spin coated on the first sub-layer. Thereafter, the second sub-layer is cured.

In accordance with some embodiments of the disclosure, a method of manufacturing a package includes at least the following steps. A carrier having a de-bonding layer formed thereon is provided. A first redistribution structure is formed on the de-bonding layer. A plurality of conductive structures is formed over the first redistribution structure. A die is placed over the first redistribution structure. The conductive structures and the die are encapsulated by an encapsulant. A second redistribution structure is formed over the conductive structures, the encapsulant, and the die. The method of forming the first redistribution structure includes at least the following steps. A buffer layer is spin coated on the de-bonding layer. Then, an auxiliary buffer layer is spin coated on the buffer layer. A material of the buffer layer is the same as a material of the auxiliary buffer layer, and a rotational speed for spin coating the buffer layer is larger than a rotational speed for spin coating the auxiliary buffer layer. Subsequently, a plurality of conductive patterns are formed on the auxiliary buffer layer. Thereafter, a dielectric layer is formed on the auxiliary buffer layer to cover the conductive patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
    a first redistribution structure, comprising:
        a composite dielectric layer comprising a first sub-layer and a second sub-layer stacked on the first sub-layer;
        a plurality of under bump metallization patterns over the first sub-layer and penetrating through the composite dielectric layer;
        a dielectric layer disposed on the second sub-layer of the composite dielectric layer, wherein a surface of the dielectric layer has a roughness larger than 0 µm and less than or equal to 0.1 µm; and
        a plurality of conductive patterns embedded in the dielectric layer, wherein a surface of each of the plurality of conductive patterns has a roughness larger than 0 µm and less than or equal to 0.5 µm;
    a die and a plurality of conductive structures on the first redistribution structure;
    an encapsulant encapsulating the die and the plurality of conductive structures; and
    a second redistribution structure over the plurality of conductive structures, the encapsulant, and the die.

2. The package according to claim 1, wherein a thickness of the composite dielectric layer ranges between 2 µm and 60 µm.

3. The package according to claim 1, wherein a ratio of a thickness of each of the plurality of conductive patterns to a thickness of the composite dielectric layer ranges between 1:30 and 10:1.

4. The package according to claim 1, wherein a ratio of a thickness of the dielectric layer to a thickness of the composite dielectric layer ranges between 1:12 and 25:1.

5. The package according to claim 1, wherein a density of the first sub-layer and a density of the second sub-layer are the same.

6. The package according to claim 1, further comprising a plurality of conductive terminals disposed on the plurality of under bump metallization patterns.

7. The package according to claim 1, wherein the first sub-layer comprises fillers and the second sub-layer is free of filler.

8. The package according to claim 1, wherein the composite dielectric layer further comprises a third sub-layer sandwiched between the first sub-layer and the second sub-layer, and the third sub-layer comprises dye.

9. The package according to claim 1, wherein a thickness of the first sub-layer is different from a thickness of the second sub-layer.

10. A method of manufacturing a package, comprising:
    providing a carrier having a de-bonding layer formed thereon;
    forming a first redistribution structure on the de-bonding layer, comprising:
        forming a composite dielectric layer on the de-bonding layer, comprising:
            spin coating a first sub-layer on the de-bonding layer;
            curing the first sub-layer;
            spin coating a second sub-layer on the first sub-layer; and
            curing the second sub-layer;
        forming a plurality of conductive patterns on the composite dielectric layer; and
        forming a dielectric layer on the composite dielectric layer to cover the plurality of conductive patterns;
    forming a plurality of conductive structures over the first redistribution structure;
    placing a die over the first redistribution structure;
    encapsulating the plurality of conductive structures and the die by an encapsulant; and
    forming a second redistribution structure over the plurality of conductive structures, the encapsulant, and the die.

11. The method according to claim 10, wherein a rotational speed for spin coating the first sub-layer is larger than a rotational speed for spin coating the second sub-layer.

12. The method according to claim 10, wherein the first sub-layer is spin coated with a rotational speed of 350 rpm to 3500 rpm, and the second sub-layer is spin coated with a rotational speed of 300 rpm to 3000 rpm.

13. The method according to claim 10, further comprising:

removing the de-bonding layer and the carrier from the first redistribution structure;

forming a plurality of openings in the composite dielectric layer, wherein the plurality of openings penetrate through the first sub-layer and the second sub-layer to expose at least a portion of the plurality of conductive patterns;

forming a plurality of under bump metallization patterns in the plurality of openings; and disposing a plurality of conductive terminals over the plurality of under bump metallization patterns.

14. The method according to claim 10, wherein the step of forming the composite dielectric layer further comprises:

forming a third sub-layer between the first sub-layer and the second sub-layer, wherein the third sub-layer comprises dye.

15. The method according to claim 10, wherein a thickness of the composite dielectric layer ranges between 2 µm and 60 µm.

16. A method of manufacturing a package, comprising:

providing a carrier having a de-bonding layer formed thereon;

forming a first redistribution structure on the de-bonding layer, comprising:

spin coating a buffer layer on the de-bonding layer;

spin coating an auxiliary buffer layer on the buffer layer, wherein a material of the buffer layer is the same as a material of the auxiliary buffer layer, and a rotational speed for spin coating the buffer layer is larger than a rotational speed for spin coating the auxiliary buffer layer;

forming a plurality of conductive patterns on the auxiliary buffer layer; and forming a dielectric layer on the auxiliary buffer layer to cover the plurality of conductive patterns;

forming a plurality of conductive structures over the first redistribution structure;

placing a die over the first redistribution structure;

encapsulating the plurality of conductive structures and the die by an encapsulant; and forming a second redistribution structure over the plurality of conductive structures, the encapsulant, and the die.

17. The method according to claim 16, wherein the step of forming the first redistribution structure further comprises:

curing the buffer layer before spin coating the auxiliary buffer layer; and curing the auxiliary buffer layer before forming the plurality of conductive patterns.

18. The method according to claim 16, wherein the buffer layer is spin coated with the rotational speed of 350 rpm to 3500 rpm, and the auxiliary buffer layer is spin coated with the rotational speed of 300 rpm to 3000 rpm.

19. The method according to claim 16, further comprising:

removing the de-bonding layer and the carrier from the first redistribution structure;

forming a plurality of openings in the buffer layer and the auxiliary buffer layer, wherein the plurality of openings penetrate through the buffer layer and the auxiliary buffer layer to expose at least a portion of the plurality of conductive patterns;

forming a plurality of under bump metallization patterns in the plurality of openings; and disposing a plurality of conductive terminals over the plurality of under bump metallization patterns.

20. The method according to claim 16, wherein the step of forming the first redistribution structure further comprises:

forming a colored layer between the buffer layer and the auxiliary buffer layer, wherein the colored layer comprises dye.

\* \* \* \* \*